(12) United States Patent
Paek et al.

(10) Patent No.: US 9,466,580 B2
(45) Date of Patent: Oct. 11, 2016

(54) SEMICONDUCTOR PACKAGE AND MANUFACTURING METHOD THEREOF

(71) Applicant: Amkor Technology, Inc., Tempe, AZ (US)

(72) Inventors: Jong Sik Paek, Incheon (KR); No Sun Park, Gwangju-si (KR)

(73) Assignee: Amkor Technology, Inc.

( * ) Notice: Subject to any disclaimer, the term of this patent is extended or adjusted under 35 U.S.C. 154(b) by 0 days.

(21) Appl. No.: 14/815,435

(22) Filed: Jul. 31, 2015

(65) Prior Publication Data

US 2016/0163662 A1    Jun. 9, 2016

(30) Foreign Application Priority Data

Dec. 3, 2014    (KR) .................. 10-2014-0172090

(51) Int. Cl.
| | |
|---|---|
| H01L 21/768 | (2006.01) |
| H01L 21/48 | (2006.01) |
| H01L 21/56 | (2006.01) |
| H01L 23/00 | (2006.01) |
| H01L 25/00 | (2006.01) |
| H01L 25/065 | (2006.01) |

(52) U.S. Cl.
CPC ......... *H01L 24/05* (2013.01); *H01L 2224/022* (2013.01); *H01L 2224/02371* (2013.01); *H01L 2224/0401* (2013.01); *H01L 2224/05024* (2013.01)

(58) Field of Classification Search
CPC ..... H01L 24/05; H01L 25/04; H01L 25/043; H01L 25/0652; H01L 25/0655; H01L 25/071; H01L 2224/022; H01L 2224/05024; H01L 2224/023; H01L 2224/0401; H01L 2224/02371; H01L 25/0657; H01L 2224/32145; H01L 2224/48145
See application file for complete search history.

(56) References Cited

U.S. PATENT DOCUMENTS

| | | | |
|---|---|---|---|
| 6,836,025 B2 * | 12/2004 | Fujisawa | H01L 23/3128 257/686 |
| 8,354,747 B1 * | 1/2013 | Kuo | B81B 7/0061 257/684 |
| 2004/0070064 A1 | 4/2004 | Yamane et al. | |
| 2012/0001326 A1 | 1/2012 | Tay et al. | |
| 2012/0312590 A1 * | 12/2012 | Maeda | H05K 1/0269 174/261 |

FOREIGN PATENT DOCUMENTS

| | | |
|---|---|---|
| KR | 10-0784388 B1 | 12/2007 |
| KR | 10-2013-0018090 A1 | 2/2013 |

OTHER PUBLICATIONS

Korean Office Action dated Mar. 3, 2016 for Korean Patent Application No. 10-2014-0172090.

\* cited by examiner

*Primary Examiner* — Jasmine Clark
(74) *Attorney, Agent, or Firm* — McAndrews, Held & Malloy, Ltd.

(57) ABSTRACT

A semiconductor device structure and a method for manufacturing a semiconductor device. As a non-limiting example, various aspects of this disclosure provide a semiconductor device structure (e.g., a sensor device structure), and method for manufacturing thereof, that comprises a three-dimensional package structure free of wire bonds, through silicon vias, and/or flip-chip bonding.

20 Claims, 6 Drawing Sheets

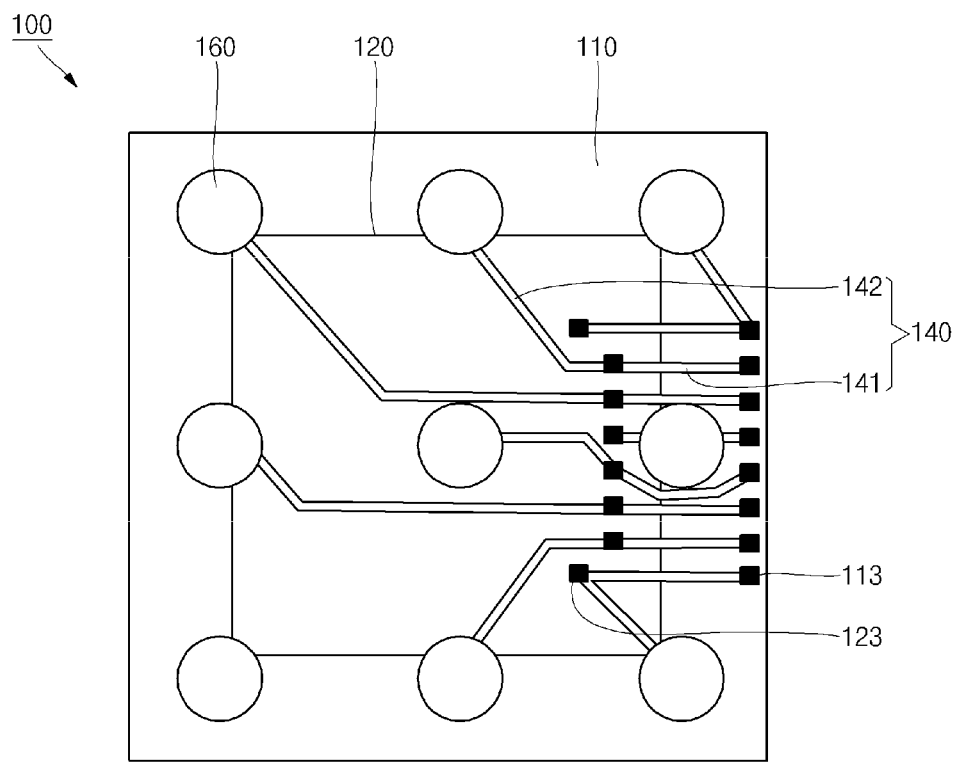

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2014-0172090, filed on Dec. 3, 2014 in the Korean Intellectual Property Office and titled "SENSOR PACKAGE AND MANUFACTURING METHOD THEREOF," the contents of which are hereby incorporated herein by reference, in their entirety.

FEDERALLY SPONSORED RESEARCH OR DEVELOPMENT

SEQUENCE LISTING

MICROFICHE/COPYRIGHT REFERENCE

BACKGROUND

Present systems, methods and/or architectures for forming semiconductor packages, for example sensor packages, are inadequate. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings:

FIGS. 1A-1G are cross-sectional views illustrating an example manufacturing method of a semiconductor device, in accordance with various aspects of the present disclosure.

SUMMARY

Figure 1A:
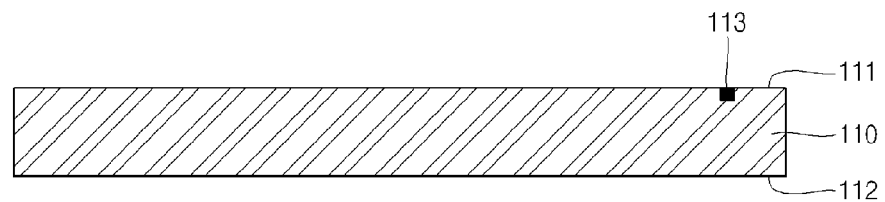

Various aspects of this disclosure provide a semiconductor device structure and a method for manufacturing a semiconductor device. As a non-limiting example, various aspects of this disclosure provide a semiconductor device structure (e.g., a sensor device structure), and method for manufacturing thereof, that comprises a three-dimensional package structure free of wire bonds, through silicon vias, and/or flip-chip bonding.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide a semiconductor device or package (e.g., a sensor package) and a manufacturing method thereof, which can reduce the thickness and/or manufacturing cost of the semiconductor device.

The above and other aspects of the present disclosure will be described in or be apparent from the following description of various example implementations.

According to an aspect of the present disclosure, there is provided a manufacturing method of a semiconductor device (e.g., a sensor package), the manufacturing method comprising preparing a first semiconductor die having a first bond pad, adhering or otherwise mounting a second semiconductor die having a second bond pad to the first semiconductor die, forming a first passivation layer on the first and second semiconductor dies to expose the first and second bond pads to the outside of the first passivation layer, connecting the first and second bond pads to a redistribution layer, and/or connecting one or more conductive attachment structures (e.g., package attachment or connecting structures, etc.) to the redistribution layer.

The first and second bond pads and the connecting structure(s) may, for example, be electrically connected to each other by the redistribution layer.

The redistribution layer may, for example, comprise a first redistribution layer trace connecting the first and second bond pads to each other and a second redistribution layer trace connecting the second bond pad and the connecting structure to each other.

The example manufacturing method may, for example, further comprise forming a second dielectric layer (e.g., a passivation layer, mold layer, etc.) on the redistribution layer, where the connecting structure(s) are exposed to the outside of the second dielectric layer.

The example manufacturing method may, for example, further comprise forming an encapsulant layer on the second dielectric layer, where the connecting structure(s) are exposed to the outside of the encapsulant layer.

A width of the first semiconductor die may, for example, be greater than a width of the second semiconductor die.

Under bump metals may, for example, be formed between the connecting structure(s) and the redistribution layer. For example, an underbump metallization ("UBM") structure may comprise a layer of titanium-tungsten (TiW), which may be referred to as a layer or seed layer. Such layer may, for example be formed by sputtering. Also for example, the UBM structure may comprise a layer of copper (Cu) on the layer of TiW. Such layer may also, for example, be formed by sputtering. Note however, that the UBM structure and/or processes utilized to form the UBM structure are not limited to the examples given. The UBM structure may, for example, comprise any number of conductive layers and/or may be formed by any of a variety of one or more processes.

The first semiconductor die may, for example, comprise a first (or upper) surface comprising the first bond pad and a second (or lower) surface opposite to the first surface, the second semiconductor die may, for example, comprise a first (or upper) surface comprising a second bond pad and a second (or lower) surface opposite to the first surface, and the first surface of the first semiconductor die may be mounted to (e.g., adhered to or otherwise attached to) the second surface of the second semiconductor die.

According to another aspect of the present disclosure, there is provided a semiconductor package (e.g., a sensor package) comprising a first semiconductor die that comprises a first bond pad formed thereon, a second semiconductor die mounted to (e.g., adhered to) the first semiconductor die and comprising a second bond pad formed thereon, a first passivation layer formed on the first and second semiconductor dies and exposing the first and second bond pads to the outside of the first passivation layer, a redistribution layer connecting the first and second bond pads to each other (e.g., bridging the entire gap between the first and second bond pads), and one or more conductive attachment structures (e.g., package attachment structures, conductive bumps, etc.) connected to the redistribution layer.

The redistribution layer may, for example, comprise a first redistribution layer trace connecting the first and second bond pads to each other and a second redistribution layer trace connecting the second bond pad and the conductive attachment structure(s) to each other.

A second dielectric layer (e.g., a passivation layer, an encapsulant layer, etc.) may, for example, be formed on the redistribution layer and the first passivation layer, where the conductive attachment structures are exposed to the outside of the second dielectric layer. An encapsulant layer may, for example, be formed on the second dielectric layer, where the conductive attachment structures are exposed to the outside of the encapsulant layer.

A width of the first semiconductor die may, for example, be greater than a width of the second semiconductor die.

The semiconductor device may, for example, comprise under bump metals between the conductive attachment structures and the redistribution layer.

As described herein, an example implementation of the present disclosure may provide a semiconductor device or package (e.g., a sensor device or sensor package) and manufacturing method thereof, which can reduce the thickness and manufacturing cost of the semiconductor device. For example, according to various aspects of the present disclosure, the first semiconductor die and the second semiconductor die and/or the conductive attachment structures may be connected to each other by a redistribution layer without a loop height (e.g., without a wire loop), thereby reducing the thickness of the sensor package. In addition, since a TSV structure is not necessarily employed, the manufacturing cost of the semiconductor device may be reduced.

Referring to FIGS. 1A through 1G, an example manufacturing method of a semiconductor device or package (e.g., a sensor package or other device) according to various aspects of the present disclosure is illustrated.

As illustrated in FIGS. 1A through 1G, the manufacturing method of a semiconductor device 100 according to various aspects of the present disclosure may comprise preparing a first semiconductor die 110, mounting a second semiconductor die 120, forming a first passivation layer 130, forming a redistribution layer 140, forming a second dielectric layer 150 (e.g., a second passivation layer, an encapsulant layer, etc.), and connecting one or more conductive attachment structures 160. In addition, the manufacturing method of a semiconductor device 100 according to an embodiment of the present invention may further include singulating when a plurality of semiconductor deices 100 are simultaneously assembled on a wafer, a strip or a panel.

As illustrated in FIG. 1A, in the preparing of the first semiconductor die 110, the first semiconductor die 110 is prepared, the first semiconductor die 110 comprising a planar first (e.g., upper) surface 111, a planar second (e.g., lower) surface 112 opposite to the first surface 111, a plurality of side surfaces between the first surface 111 and the second surface 112 (which might not, for example, exist until after singulation of the first semiconductor die 110), and a first bond pad 113 formed on the first surface 111. The first semiconductor die 110 may be, for example, comprise a general semiconductor die and/or a sensor die (e.g., a terrestrial magnetism sensor, a GPS sensor, an inertial sensor, an environment sensor, a chemical sensor, a pressure sensor, a sound sensor, a light sensor, a video sensor, a proximity sensor, and/or equivalents thereof), but aspects of the present disclosure are not limited thereto. The semiconductor die 110 may also, for example, comprise a sensor controller (or processor) die.

Figure 1B:
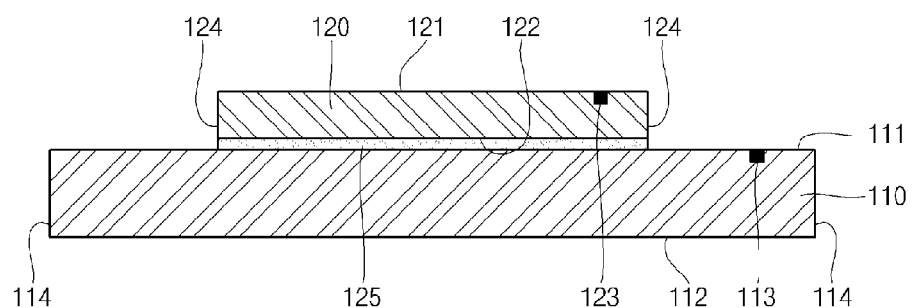

As illustrated in FIG. 1B, in the mounting of the second semiconductor die 120, the second semiconductor die 120 is prepared, the second semiconductor die 120 comprising a planar first (e.g., upper) surface 121, a planar second (e.g., lower) surface 122 opposite to the first surface 121, a plurality of side surfaces between the first surface 121 and second surface 121, and a second bond pad 123 formed on the first surface 121, and the second surface 122 of the second semiconductor die 120 may be mounted to the first surface of the first semiconductor die 110 (e.g., adhesively attached). The second semiconductor die 120 may, for example, comprise a general semiconductor die, a sensor controller (or processor) die, for example for processing a sensing signal received from the first semiconductor die 110, and equivalents thereof, but aspects of the present invention are not limited thereto. The second semiconductor die 120 may also, for example, comprise a sensor die (e.g., a terrestrial magnetism sensor, a GPS sensor, an inertial sensor, an environment sensor, a chemical sensor, a pressure sensor, a sound sensor, a light sensor, a video sensor, a proximity sensor, and/or equivalents thereof), but aspects of the present disclosure are not limited thereto.

The second semiconductor die 120 may be mounted (e.g., directly or indirectly mounted) to the first semiconductor die 110 in any of a variety of manners (e.g., utilizing adhesive paste or tape, utilizing solder, etc.). In an example scenario in which adhesive is utilized, the adhesive 125 may, for example, comprise one or more of: a general epoxy resin, a double-sided adhesive tape and/or equivalents thereof, but aspects of the present disclosure are not limited thereto.

In addition, since the first semiconductor die 110 may be relatively wider than the second semiconductor die 120, opposite ends 114 of the first semiconductor die 110 may extend laterally beyond opposite ends 124 of the second semiconductor die 120 and extend laterally outward a predetermined length. In addition, the first bond pad 113 of the first semiconductor die 110 might not be covered by the second semiconductor die 120, but rather exposed (e.g., laterally beyond the second semiconductor die 120). Accordingly, the example first passivation layer 130, the redistribution layer 140, the second dielectric layer 150 (e.g., second passivation layer) and the conductive structure(s) 160, which will later be described, may be formed on the first surface 111 of the first semiconductor die 110. It should be noted that while only a single second semiconductor die 120 is shown mounted to the first semiconductor die 110, a plurality of such second semiconductor dies 120 may be similarly mounted and/or processed as discussed herein.

Figure 1C:
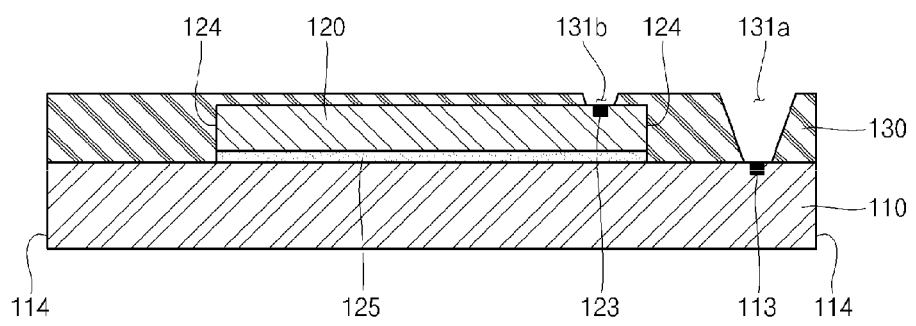

As illustrated in FIG. 1C, in the forming of the first passivation layer 130, the first passivation layer 130 (e.g., having a predetermined thickness) is formed on the first surface 111 of the first semiconductor die 110 and the first surface 121 of the second semiconductor die 120. Here, not only the first surface 121 of the second semiconductor die 120 but also the opposite ends 124 and/or all sides thereof are surrounded by the first passivation layer 130.

The first passivation layer 130 may be formed in any of a variety of manners. For example, the first passivation layer 130 may be formed by one of screen printing, spin coating, spray depositing, and equivalents thereof, but aspects of the present disclosure are not limited thereto.

In addition, apertures (or openings) 131a and 131b each having a predetermined diameter may be formed in the first passivation layer 130 (e.g., by a photolithography process and/or an etching process, etc.), and the apertures 131a and 131b allow the first bond pad 113 of the first semiconductor die 110 and the second bond pad 123 of the second semiconductor die 120 to be exposed to the outside of the first passivation layer 130. For example, the first bond pad 113 may be exposed to the outside through the first opening 131a and the second bond pad 123 may be exposed to the outside through the second opening 131b. In the illustrated example, since a distance from a top surface of the first passivation layer 130 to the first surface 111 of the first semiconductor die 110 is greater than a distance from a top surface of the first passivation layer 130 to the first surface 121 of the second semiconductor die 120, a depth of the first opening 131a is greater than a depth of the second opening 131b. In the example shown, the entire top surface of the first passivation layer 130 (e.g., the portion of the first passivation layer 130 directly above the first semiconductor die 110 and not the second semiconductor die 120, and the portion of the first passivation layer 130 directly above the second semiconductor die 120) may be in a single plane. Alternatively, the first passivation layer 130 may be a constant thickness throughout (e.g., with the top surface of the first passivation layer 130 generally following the contour of the first semiconductor die 110 and the second semiconductor die 120). Alternatively, the first passivation layer 130 may be thicker directly above the first semiconductor die 110 and not the second semiconductor die 120 than the thickness of the first passivation layer 130 directly above the second semiconductor die 120, yet not result in the entire top surface of the first passivation layer 130 being coplanar.

As an example, the first passivation layer 130 may be made of one or more passivation layer materials comprising bismaleimidetriazine (BT), phenolic resin, polyimide (PI), benzo cyclo butene (BCB), poly benz oxazole (PBO), epoxy and equivalents thereof or mixtures thereof, but aspects of the present disclosure are not limited thereto. For example, the first passivation layer 130 may also be made of one or more passivation layer materials comprising silicon oxide, silicon nitride and equivalents thereof. These inorganic layers may, for example, be formed by one or more of chemical vapor deposition (CVD), physical vapor deposition (PVD) and equivalents thereof, but aspects of this disclosure are not limited thereto.

Figure 1D:
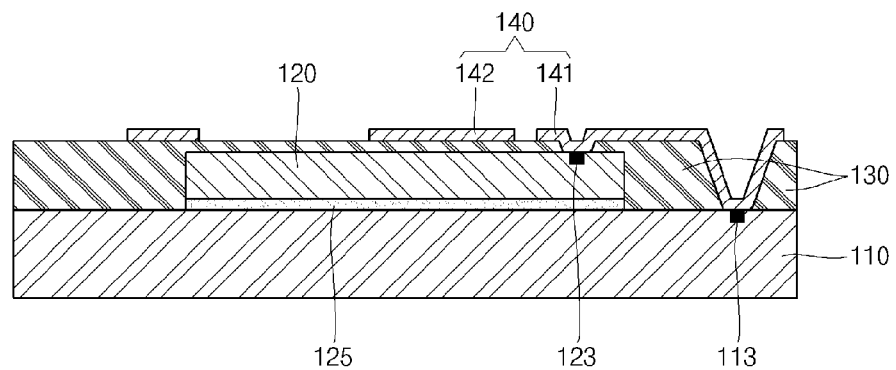

As illustrated in FIG. 1D, in the forming of the redistribution layer 140, the redistribution layer 140 may be formed to electrically connect the first bond pad 113 and the second bond pad 123 to each other. The redistribution layer 140 may, for example, formed on the first passivation layer 130 (e.g., directly on the first passivation layer 130, including the apertures 131a and 131b, on the bond pads 112 and 123, etc.), and the conductive connection structure(s) 160 to be described later may be connected to the redistribution layer 140. For example, the redistribution layer 140 may comprise a first redistribution layer 141 trace connecting the first bond pad 113 and the second bond pad 123 to each other and a second redistribution layer trace 142 connecting the second bond pad 123 and the conductive attachment structure(s) 160 to each other. The first redistribution layer trace 141 and the second redistribution layer trace 142 may thus be connected to each other (see FIG. 1G.).

The redistribution layer 140 may, for example, be formed by forming a seed layer made of tungsten (W) or titanium tungsten (TiW) on the first and second apertures 131a and 131b, including on the first and second bond pads 113 and 123, and on the first passivation layer 130 (e.g., by plating, sputtering, or other deposition process), forming a conductive layer made of copper (Cu) on the seed layer by plating (e.g., relatively thickly compared to the seed layer), and patterning the redistribution layer 140 in a desired manner by a photolithography process and/or an etching process, but aspects of the present invention are not limited by characteristics of any particular material and/or process.

Figure 1E:
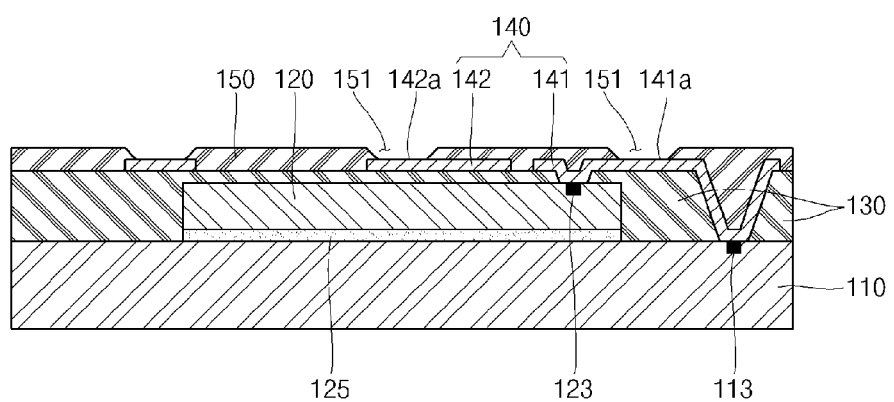

As illustrated in FIG. 1E, in the forming of the dielectric layer 150 (e.g., a second passivation layer, an encapsulation layer, etc.), the dielectric layer 150 is formed on the redistribution layer 140 and the first passivation layer 130 positioned around the redistribution layer 140. In this example, the dielectric layer 150 comprises a second passivation layer, but as will be discussed herein (e.g., with regard to FIGS. 3 and 4), the dielectric layer 150 may comprise an encapsulation layer. Accordingly, for this example, the dielectric layer 150 may also be referred to herein in a non-limiting manner as the second passivation layer 150.

As described herein with regard to the first passivation layer 130, the second passivation layer 150 may be formed by one of screen printing, spin coating, spray depositing, and equivalents thereof, but aspects of the present disclosure are not limited thereto.

For example, apertures (or openings) 151 each having a predetermined diameter may be formed in the second passivation layer 150 (e.g., by a photolithography process and/or an etching process, etc.), and the apertures 151 allow land regions 141a and 142a of the redistribution layer 140, which will be connected to the conductive structures 160, to be exposed to the outside of the second passivation layer 150.

As with the first passivation layer 130, the second passivation layer 150 may be made of one or more passivation layer materials comprising bismaleimidetriazine (BT), phenolic resin, polyimide (PI), benzo cyclo butene (BCB), poly benz oxazole (PBO), epoxy and equivalents thereof or mixtures thereof, but aspects of the present disclosure are not limited thereto. For example, the second passivation layer 150 may also be made of one or more passivation layer materials comprising silicon oxide, silicon nitride and equivalents thereof. These inorganic layers may, for example, be formed by one of chemical vapor deposition (CVD), physical vapor deposition (PVD) and equivalents thereof, but aspects of this disclosure are not limited thereto. In an example implementation, the first passivation layer 130 and the second passivation layer 150 may be formed using different respective processes.

Note that the second passivation layer 150 is illustrated as being thinner than the first passivation layer 130, but this need not be the case. For example, the second passivation layer 150 may be as thick as, or thicker than, the first passivation layer 130.

Also note that although only one conductive layer of the redistribution layer 140 is illustrated, a plurality of such conductive layers may be formed in alternating fashion with dielectric layers (e.g., in a multi-layer redistribution layer configuration).

Figure 1F:
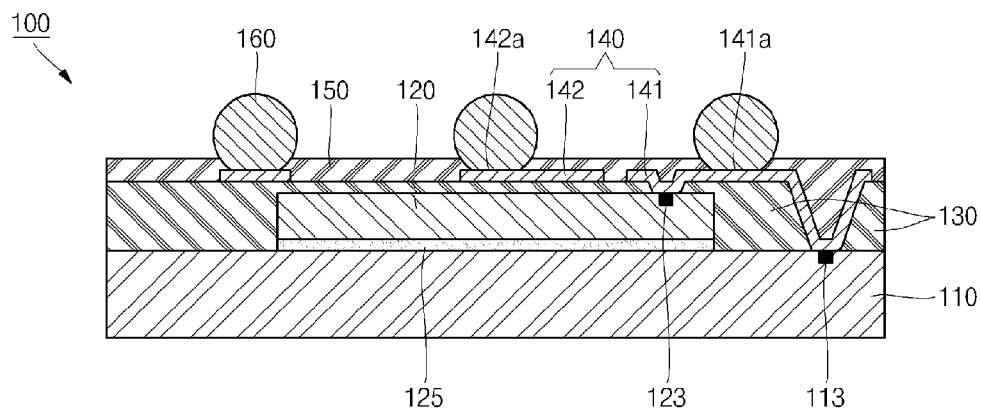

As illustrated in FIGS. 1F and 1G, in the connecting of the conductive attachment (or connection) structures 160 (which may also be referred to herein generally as "conductive structures 160"), the conductive structures 160 are connected to the redistribution layer 140 exposed to the outside of the second passivation layer 150 through the openings 151 of the second passivation layer 150, for example, to the land regions 141a and 142a, thereby making the conductive structures 160 protrude to the outside of the second passivation layer 150. The conductive structures 160 may comprise one or more of any of a variety of conductive structures utilized for interconnection between semiconductor devices or packages. For example, the connection structures 160 may comprise conductive bumps or balls, conductive pillars (e.g., copper pillars) or wires, pastes, adhesives, etc.

For example, the conductive structures 160 may be connected in the following manner. After a volatile flux is coated on the land regions 141a and 142a, the conductive structures (e.g., bumps) 160 in solid phases may be temporarily connected on the flux. Thereafter, a reflow temperature of approximately 150° C. to 250° C. is supplied, thereby volatilizing the flux for removal, and melting the conductive structures 160 to then be directly connected to the land regions 141a and 142a. Here, the conductive structures 160 become substantially spherical by surface tension and are then solidified by cooling. In another example, the conductive structures 160 may be plated, printed, or otherwise deposited.

The conductive structures 160 may, for example, be made of one or more materials comprising a eutectic solder ($Sn_{37}Pb$), a high lead solder ($Sn_{95}Pb$), a lead-free solder (SnAg, SnAu, SnCu, SnZn, SnZnBi, SnAgCu, SnAgBi, etc.) and equivalents thereof, but aspects of the present invention are not limited thereto. The conductive structures 160 may, for example, be made of one or more material comprising plated metal (e.g., Cu, Au, Si, etc.), plated solder, etc.

As described here, according to various aspects of the present disclosure, a plurality of semiconductor devices or packages 100 (e.g., sensor packages 100) may be simultaneously or concurrently manufactured in forms of wafers, strips or panels. In this case, after the connecting of the conductive attachment structures 160, the manufacturing method of the present invention may further include singulation of the individual devices or packages. Such singulation may, for example, be performed by sawing with a blade (e.g., with a diamond blade), punching, cutting with a laser beam or other energy beam, etc., but aspects of the present disclosure are not limited thereto.

In the singulating, the singulating may be performed sequentially on the first semiconductor die 110, the first passivation layer 130 and the second passivation layer 150 in that order, or sequentially on the second passivation layer 150, the first passivation layer 130 and the first semiconductor die 110 in that order. In such a manner, opposite ends of each of the first semiconductor die 110, the first passivation layer 130 and the second passivation layer 150 become coplanar. Also for example, the singulating of all layers may be performed substantially simultaneously. In an example implementation, for example following such singulation, the side surfaces (or end surfaces) of the first semiconductor die 110 may be exposed. Such exposed surfaces may be left as-is or may be subsequently covered with a protective coating.

As shown in FIG. 1G, first and second bond pads of the first and second semiconductor dies, respectively, may be located toward a single side of their respective dies. Alternatively, such bond pads may be dispersed around the entire perimeters of the dies or portions of the entire perimeters. Also, though the second semiconductor die 120 is generally illustrated as being centered on the first semiconductor die 110, this disclosure is not limited to such a configuration. For example, the second semiconductor die 120 may be located off-center on the first semiconductor die 110.

As described above, in one example implementation, the semiconductor device or package 100 having reduced thickness and manufacturing cost and the manufacturing method thereof are provided. That is to say, according to various aspects of the present disclosure, since the first semiconductor die 110 and the second semiconductor die 120 and/or the conductive structures 160 are connected to each other by the redistribution layer 140 without a loop height, the thickness of the semiconductor device 100 can be reduced.

In addition, since a TSV structure is not necessarily employed, the manufacturing cost of the semiconductor device 100 can be reduced.

Hereinafter, other example implementations of the present disclosure will be described with regard to other respective configurations of the semiconductor device 100. It should be noted that any of the example implementations discussed herein may share any one or more characteristics with any one or more of the other example implementations discussed herein.

Figure 2:
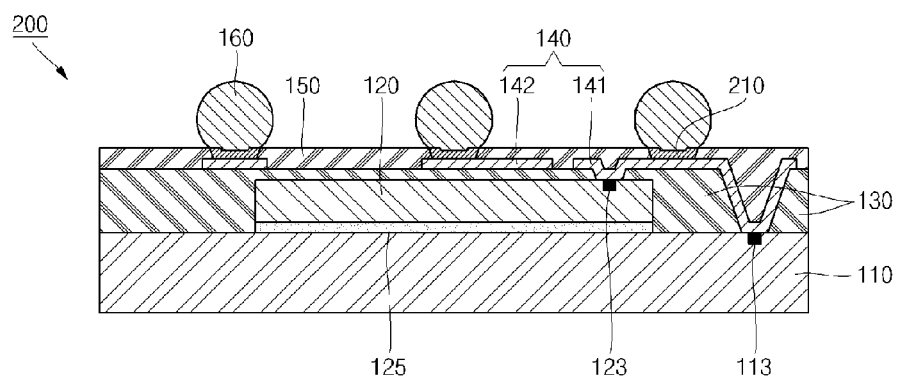
FIG. 2 is a cross-sectional view illustrating an example semiconductor device, in accordance with various aspects of the present disclosure.

Referring to FIG. 2, a cross-sectional view of an example semiconductor device 200 in accordance with various aspects of the present disclosure is illustrated. The semiconductor device (or package) 200 may, for example, share any or all characteristics with any of the other example semiconductor devices 100, 300, 400, 500, and 600 discussed herein.

As illustrated in FIG. 2, under bump metals 210, for example, may be formed on a redistribution layer 140, thereby electrically connecting conductive attachment structures 160 to the redistribution layer 140 in a more secure manner. For example, in an example implementation, no intermetallic compound is formed between the conductive attachment structures 160 and the redistribution layer 140 by the under bump metals 210, thereby reducing contact resistance between the conductive structures 160 and the redistribution layer 140 and ultimately improving connection reliability therebetween.

The under bump metals 210 may comprise, for example, a palladium (Pd) layer plated on the redistribution layer 140, a nickel (Ni) layer plated on the Pd layer, and a gold (Au) or silver (Ag) layer plated on the Ni layer. However, the present invention does not limit the kinds of the under bump metals 210 to those listed herein. Various kinds of under bump metals other than those listed herein may be provided.

Even if, for example, the under bump metals 210 are not provided, an anti-oxidation layer, such as a gold (Au) or silver (Ag) layer, may be formed on a surface (i.e., land regions) of the redistribution layer 140 connected to the conductive attachment structures 160.

Figure 3:
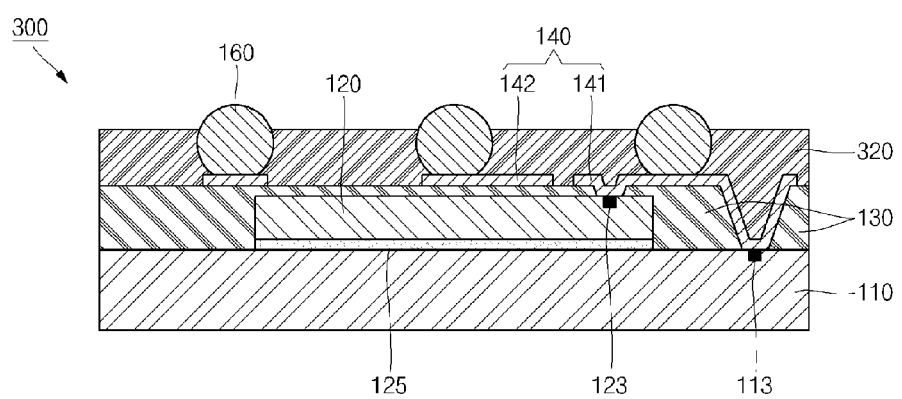
FIG. 3 is a cross-sectional view illustrating another example semiconductor device, in accordance with various aspects of the present disclosure.

Referring to FIG. 3, a cross-sectional view of an example semiconductor device 300 in accordance with various aspects of the present disclosure is illustrated. The semiconductor device (or package) 300 may, for example, share any or all characteristics with any of the other example semiconductor devices 100, 200, 400, 500, and 600 discussed herein.

As illustrated in FIG. 3, a dielectric layer 320 comprising an encapsulant layer 320 (e.g., instead of a second passivation layer 150 as formed in the example semiconductor device 100 of FIG. 1), may be formed on a redistribution layer 140 and a first passivation layer 130. The example encapsulant layer 320 is formed to approximately ¼ to ¾ the overall height of the conductive structures 160, thereby tightly fixing the peripheral regions of the conductive structures 160 by the encapsulant layer 320. Therefore, the connection reliability between the conductive structures 160 and the redistribution layer 140 may be improved. With this configuration, the conductive structures 160 are exposed to the outside of the encapsulant layer 320.

The encapsulant layer 320 may, for example, be formed by a general transfer molding process using a mold, a dispensing process using a dispenser, or the like. In addition, the encapsulant layer 320 may be made of an epoxy molding compound including a filler, an epoxy resin, a hardener and a flame retardant, and equivalents thereof, but aspects of the present invention are not limited thereto.

Figure 4:
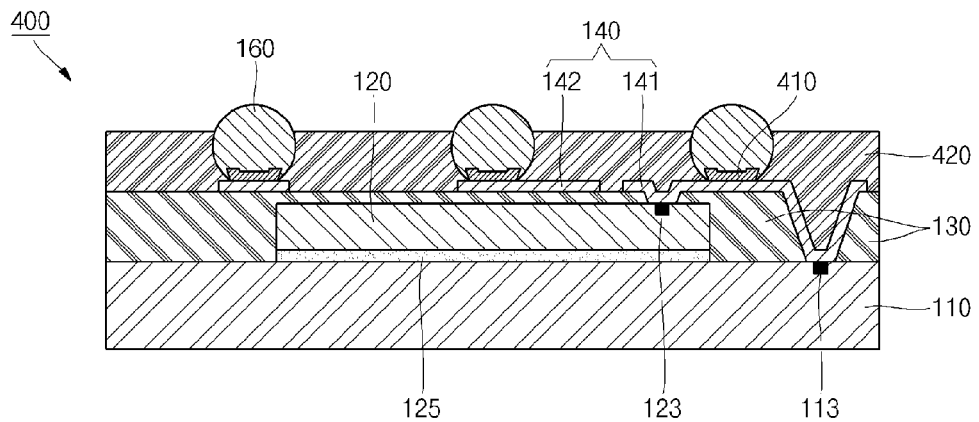
FIG. 4 is a cross-sectional view illustrating an additional example semiconductor device, in accordance with various aspects of the present disclosure.

Referring to FIG. 4, a cross-sectional view of an example semiconductor device 400 in accordance with various aspects of the present disclosure is illustrated. The semiconductor device (or package) 400 may, for example, share any or all characteristics with any of the other example semiconductor devices 100, 200, 300, 500, and 600 discussed herein.

As illustrated in FIG. 4, under bump metals 410, for example, may be formed on a redistribution layer 140, thereby connecting conductive attachment structures 160 to the redistribution layer 140 via the under bump metals 410. Such under bump metallization is discussed herein, for example in the discussion of FIG. 2. In addition, a dielectric layer 420 comprising an encapsulant layer 420 may be formed on the redistribution layer 140 and a first passivation layer 130. Such an encapsulant layer 420 is discussed herein, for example in the discussion of FIG. 3. The encapsulant layer 420 may, for example, be formed to ¼ to ¾ the overall height of the conductive structures 160.

Accordingly, the under bump metals 410 may improve connection reliability between the conductive structures 160 and the redistribution layer 140. In addition, the encapsulant layer 420 may improve coupling forces between the conductive structures 160 and the encapsulant layer 420.

Figure 5:
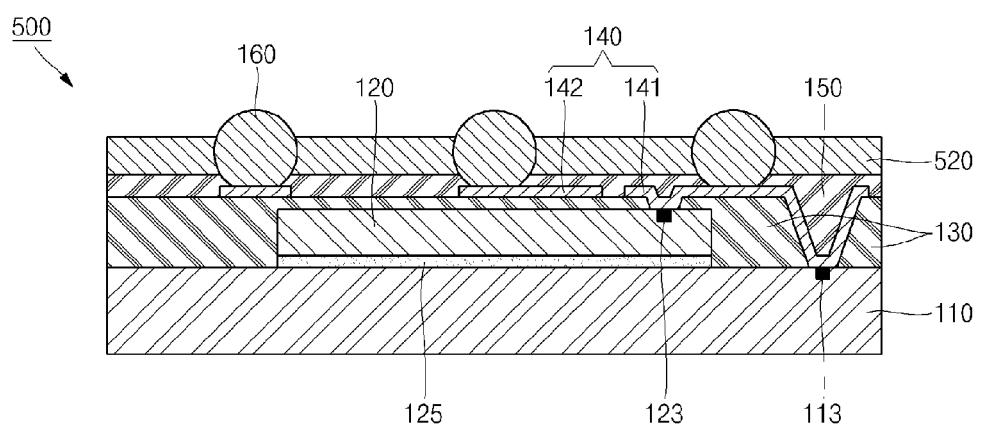
FIG. 5 is a cross-sectional view illustrating a further example semiconductor device, in accordance with various aspects of the present disclosure.

Referring to FIG. 5, a cross-sectional view of an example semiconductor device 500 in accordance with various aspects of the present disclosure is illustrated. The semiconductor device (or package) 500 may, for example, share any or all characteristics with any of the other example semiconductor devices 100, 200, 300, 400, and 600 discussed herein.

As illustrated in FIG. 5, for example in addition to the structure shown in FIG. 1F and discussed herein, an encapsulant layer 520 may further be formed on a second passivation layer 150. An example of encapsulant layer formation was presented in the discussion of FIG. 3. The encapsulant layer 520 may, for example, be formed to approximately ¼ to ¾ the overall height of conductive structures 160, thereby tightly fixing the peripheral regions of the conductive structures 160 by the encapsulant layer 520. Therefore, the connection reliability between the conductive structures 160 and the redistribution layer 140 can be improved.

Figure 6:
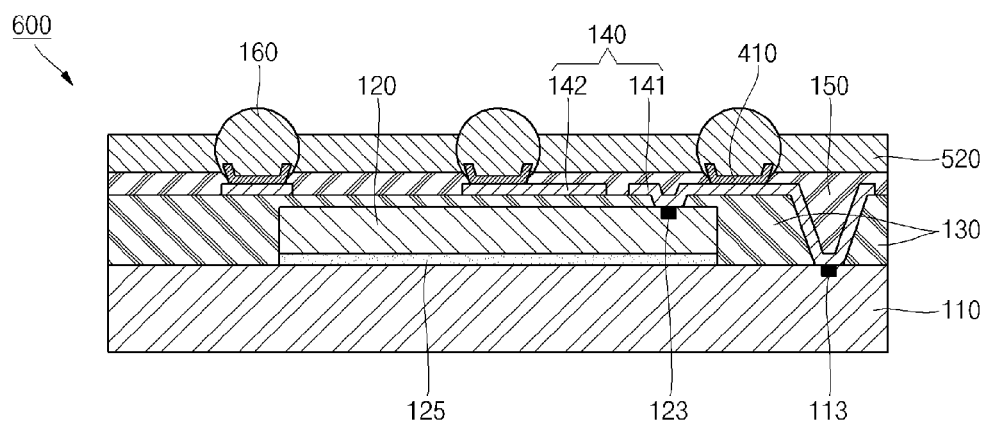
FIG. 6 is a cross-sectional view illustrating yet another example semiconductor device, in accordance with various aspects of the present disclosure.

Referring to FIG. 6, a cross-sectional view of an example semiconductor device 600 in accordance with various aspects of the present disclosure is illustrated. The semiconductor device (or package) 600 may, for example, share any or all characteristics with any of the other example semiconductor devices 100, 200, 300, 400, and 500 discussed herein As illustrated in FIG. 6, under bump metals 410, for example, may be formed on a redistribution layer 140, thereby electrically connecting conductive structures 160 to the redistribution layer 140 in a more secure manner. For example, in an example implementation, no intermetallic compound is formed between the conductive structures 160 and the redistribution layer 140 by the under bump metals 410, thereby reducing contact resistance between the conductive structures 160 and the redistribution layer 140 and ultimately improving connection reliability therebetween. Such under bump metallization is discussed herein, for example in the discussion of FIG. 2.

The under bump metals 410 may include, for example, a palladium (Pd) layer plated on the redistribution layer 140, a nickel (Ni) layer plated on the Pd layer, and a gold (Au) or silver (Ag) layer plated on the Ni layer. However, the present invention does not limit the kinds of the under bump metals 410 to those listed herein. Various kinds of under bump metals other than those listed herein may be provided.

Even if, for example, the under bump metals 410 are not provided, an anti-oxidation layer, such as a gold (Au) or silver (Ag) layer, may be formed on a surface (i.e., land regions) of the redistribution layer 140 connected to the conductive structures 160.

In summary, various aspects of this disclosure provide a semiconductor device or package structure and a method for manufacturing thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A semiconductor package comprising:
   a first semiconductor die comprising a top first die surface, a bottom first die surface, first die sides between the top and bottom first die surfaces, and a first bond pad on the top first die surface;
   a second semiconductor die comprising a top second die surface, a bottom second die surface, second die sides between the top and bottom second die surfaces, and a second bond pad on the top second die surface, where the bottom second die surface is mounted directly to the top first die surface;
   a passivation layer on the first and second semiconductor dies, where the passivation layer comprises:
      a top passivation layer surface;
      a bottom passivation layer surface on at least the top first die surface and the top second die surface;
      a first passivation layer aperture that extends from the top passivation layer surface to the first bond pad; and
      a second passivation layer aperture that extends from the top passivation layer surface to the second bond pad; and
   a conductive layer on the passivation layer that extends between and electrically connects the first and second bond pads.

2. The semiconductor package of claim 1, wherein the entire top passivation layer surface is in a single plane.

3. The semiconductor package of claim 1, wherein the top first die surface is the only surface of the first semiconductor die on which the passivation layer is located.

4. The semiconductor package of claim 1, wherein the bottom second die surface is mounted directly to the top first die surface utilizing an adhesive.

5. The semiconductor package of claim 1, wherein the top first die surface comprises an active semiconductor surface.

6. A semiconductor package comprising:
   a first semiconductor die comprising a top first die surface, a bottom first die surface, first die sides between the top and bottom first die surfaces, and a first bond pad on the top first die surface;
   a second semiconductor die comprising a top second die surface, a bottom second die surface, second die sides between the top and bottom second die surfaces, and a second bond pad on the top second die surface, where the bottom second die surface is mounted on to the top first die surface;
   a passivation layer on the first and second semiconductor dies, where the passivation layer comprises:
      a top passivation layer surface;
      a bottom passivation layer surface on at least the top first die surface and the top second die surface;
      a first passivation layer aperture that extends from the top passivation layer surface to the first bond pad; and
      a second passivation layer aperture that extends from the top passivation layer surface to the second bond pad;
   a conductive layer on the passivation layer that extends between and electrically connects the first and second bond pads; and
   a seed layer between the conductive layer and the passivation layer.

7. The semiconductor package of claim 1, comprising a conductive attachment structure electrically coupled to the conductive layer, wherein the conductive attachment structure is directly connected to the conductive layer.

8. The semiconductor package of claim 1, comprising:
   an under-bump metal structure connected to the conductive layer; and
   a conductive attachment structure connected to the under-bump metal structure.

9. The semiconductor package of claim 1, comprising a conductive attachment structure electrically coupled to the conductive layer, wherein the conductive attachment structure is laterally displaced from the first and second bond pads.

10. The semiconductor package of claim 1, comprising a dielectric layer on the passivation layer, wherein the dielectric layer comprises:
    a top dielectric layer surface;
    a bottom dielectric layer surface on at least the top passivation layer surface; and
    a dielectric layer aperture that extends from the top dielectric layer surface to the conductive layer.

11. A semiconductor package comprising:
    a first semiconductor die comprising a top first die surface, a bottom first die surface, first die sides between the top and bottom first die surfaces, and a first bond pad on the top first die surface;
    a second semiconductor die comprising a top second die surface, a bottom second die surface, second die sides between the top and bottom second die surfaces, and a second bond pad on the top second die surface, where the bottom second die surface is mounted on the top first die surface;
    a passivation layer on the first and second semiconductor dies, wherein the passivation layer comprises:
       a top passivation layer surface;
       a bottom passivation layer surface on at least the top first die surface and the top second die surface;
       a first passivation layer aperture that extends from the top passivation layer surface to the first bond pad; and
       a second passivation layer aperture that extends from the top passivation layer surface to the second bond pad;
    a conductive layer on the passivation layer that extends between and electrically connects the first and second bond pads; and a dielectric layer on the passivation layer, wherein the dielectric layer comprises:
a passivation layer material;
a top dielectric layer surface;
a bottom dielectric layer surface on at least the top passivation layer surface; and
a dielectric layer aperture that extends from the top dielectric layer surface to the conductive layer.

12. The semiconductor package of claim 1, wherein the dielectric layer comprises a same material as the passivation layer.

13. The semiconductor package of claim 10, wherein the dielectric layer comprises a mold material.

14. The semiconductor package of claim 10, comprising a conductive attachment structure electrically coupled to the conductive layer through the dielectric layer aperture.

15. A sensor package comprising:
a first semiconductor die comprising a top first die surface, a bottom first die surface, first die sides between the top and bottom first die surfaces, and a first bond pad on the top first die surface;
a second semiconductor die comprising a top second die surface, a bottom second die surface, second die sides between the top and bottom second die surfaces, and a second bond pad on the top second die surface, where the bottom second die surface is mounted on the top first die surface;
a dielectric layer of a single dielectric material on the first and second semiconductor dies, where the dielectric layer comprises:
a top dielectric layer surface;
a bottom dielectric layer surface on at least the top first die surface and the top second die surface and surrounding the second die sides;
a first dielectric layer aperture that extends from the top dielectric layer surface to the first bond pad; and
a second dielectric layer aperture that extends from the top dielectric layer surface to the second bond pad; and
a conductive layer on the dielectric layer that extends between and electrically connects the first and second bond pads.

16. The sensor package of claim 15, wherein the dielectric material comprises a passivation layer material.

17. The sensor package of claim 15, wherein the dielectric layer comprises a dielectric layer side surface between the top dielectric layer surface and the bottom dielectric layer surface, and the dielectric layer side surface is coplanar with one of the first die sides.

18. A semiconductor package comprising:
a first semiconductor die comprising a top first die surface, a bottom first die surface, first die sides between the top and bottom first die surfaces, and a first bond pad on the top first die surface;
a second semiconductor die comprising a top second die surface, a bottom second die surface, second die sides between the top and bottom second die surfaces, and a second bond pad on the top second die surface, where the bottom second die surface is mounted on the top first die surface;
a passivation layer on the first and second semiconductor dies, where the passivation layer comprises:
a top passivation layer surface;
a bottom passivation layer surface on at least top first die surface and the top second die surface;
a first passivation layer aperture that extends from the top passivation layer surface to the first bond pad; and
a second passivation layer aperture that extends from the top passivation layer surface to the second bond pad,
wherein the entire top passivation layer surface is in a same plane;
a redistribution layer on the passivation layer that extends between and electrically connects the first and second bond pads; and
a dielectric layer comprising:
a top dielectric layer surface;
a bottom dielectric layer surface on at least the top passivation layer surface; and
a dielectric layer aperture that extends from the top dielectric layer surface to the redistribution layer,
wherein at least a portion of the redistribution layer is between the passivation layer and the dielectric layer, and the dielectric layer comprises a mold material.

19. The semiconductor package of claim 18, wherein:
the dielectric layer comprises a dielectric layer side surface between the top dielectric layer surface and the bottom dielectric layer surface;
the passivation layer comprises a passivation layer side surface between the top passivation layer surface and the bottom passivation layer surface; and
the dielectric layer side surface, the passivation layer side surface, and one of the first die sides are coplanar.

20. The semiconductor package of claim 18, wherein the bottom passivation layer surface directly contacts the top first die surface.

* * * * *